United States Patent
Tsuda

(10) Patent No.: US 6,646,497 B2
(45) Date of Patent: Nov. 11, 2003

(54) FILTER APPARATUS

(75) Inventor: Shinichiro Tsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/940,569

(22) Filed: Aug. 28, 2001

(65) Prior Publication Data

US 2002/0041201 A1 Apr. 11, 2002

(30) Foreign Application Priority Data

Aug. 30, 2000 (JP) ........................................ 2000-261394

(51) Int. Cl.$^7$ ................................................ H03K 5/00
(52) U.S. Cl. ........................ 327/552; 327/553; 327/558
(58) Field of Search ................................... 327/551–558

(56) References Cited

U.S. PATENT DOCUMENTS 5,182,478 A * 1/1993 Nomura ....................... 327/553
5,239,367 A * 8/1993 Sato ............................ 348/571

* cited by examiner

*Primary Examiner*—Kenneth B. Wells
(74) *Attorney, Agent, or Firm*—Frommer Lawrence & Haug LLP; William S. Frommer; Bruno Polito

(57) ABSTRACT

A subordinate low pass filter 21 having characteristics similar to those of a main low pass filter 11 is provided. A signal of a frequency corresponding to a cut-off frequency is supplied from a signal generating circuit 22 to the subordinate LPF 21. A phase difference detecting circuit 23 detects a phase shift amount which is caused when the signal of the cut-off frequency is supplied to the subordinate LPF 21. An error detecting circuit 24 compares a value corresponding to the phase shift amount caused in the subordinate LPF 21 when the signal of the cut-off frequency is supplied with a reference value corresponding to the phase shift amount to be caused in the subordinate LPF 21 at the time of the cut-off frequency on phase characteristics. A comparison output is used as a control signal and the subordinate LPF 21 and main LPF 11 are controlled to have a desired cut-off frequency. By using multipliers of similar constructions as a phase difference detecting circuit 23 and a reference value generating circuit 25, an influence of temperature characteristics and a variation on processes can be cancelled.

7 Claims, 10 Drawing Sheets

FILTER APPARATUS

BACKGROUND OF THE INVENTION

1. Field of the Invention

The invention relates to a filter apparatus suitable for use, for example, as a low pass filter of a receiving apparatus of a direct conversion system.

2. Description of the Related Arts

Hitherto, a receiving circuit of a radio communicating apparatus such as a cellular phone generally has had a construction of a super heterodyne system such that a received radio frequency (RF) signal is down-converted into an intermediate frequency (IF) signal and, thereafter, a base band signal is demodulated. FIG. 1 shows an example of the receiving circuit of such a super heterodyne system.

In FIG. 1, an RF signal received by an antenna 101 is amplified by an LNA (Low Noise Amplifier) 102 and, thereafter, supplied to a multiplier 104. A local oscillation signal is supplied to the multiplier 104 from a PLL (Phase Locked Loop) synthesizer 103. The RF signal and the local oscillation signal from the PLL synthesizer 103 are multiplied by the multiplier 104 and the reception RF signal is down-converted into an IF signal.

An output of the multiplier 104 is supplied to a band pass filter (BPF) 105. For example, an SAW (Surface Acoustic Wave) filter is used as a band pass filter 105. An output of the band pass filter 105 is supplied to multipliers 107A and 107B.

An output of a local oscillator 108 is supplied to the multiplier 107A. The output of the local oscillator 108 is phase-shifted by 90° through a phase shifter 109 and supplied to the multiplier 107B.

The IF signal and the output of the local oscillator 108 are multiplied by the multiplier 107A. The IF signal and the output of the local oscillator 108 which was phase-shifted by 90° by the phase shifter 109 are multiplied by the multiplier 107B. An I signal is demodulated by the multiplier 107A. A Q signal is demodulated by the multiplier 107B. Outputs of the multipliers 107A and 107B are supplied to an orthogonal demodulating circuit 110.

As mentioned above, hitherto, the receiving circuit of the radio communicating apparatus has used the super heterodyne system such that after the received RF signal is down-converted into the IF signal, the base band signal is demodulated.

According to the super heterodyne system, however, since an image frequency is generated when the RF signal is down-converted into the IF signal, it is necessary to provide a band pass filter for an IF circuit. A SAW filter is used as such a band pass filter. It is, therefore, difficult to form an integrated circuit and it becomes an obstacle to miniaturization.

Therefore, as such a receiving circuit of a mobile wireless apparatus, a method of reducing a circuit scale by using a direct conversion system is considered. According to the direct conversion system, since no image frequency is generated, the band pass filter for removing the image frequency can be omitted.

In the case of using the direct conversion system, a low pass filter is inserted after the I signal and Q signal are orthogonally demodulated by the multiplier. As such a low pass filter, since the base band signal is directly demodulated, a frequency which is handled is difficult to use the SAW filter.

Therefore, an active filter comprising a semiconductor device, a resistor, and a capacitor is generally used as such a low pass filter.

However, the active filter has a problem such that characteristics are changed due to a fluctuation in power source voltage or variations on processes and temperature characteristics of a transistor, the resistor, and the capacitor. Particularly, it is demanded to make cut-off characteristics constant in order to realize stable attenuating characteristics.

OBJECTS AND SUMMARY OF THE INVENTION

It is, therefore, an object of the invention to provide a filter apparatus and a filter control method in which characteristics can be made constant irrespective of a fluctuation in power source voltage or variations on processes and temperature characteristics and to provide a receiving apparatus using such a filter apparatus.

According to a preferred aspect of the invention, there is provided a filter apparatus comprising: a main filter which has an input terminal and an output terminal and whose characteristics can be set by an external control signal; a subordinate filter having substantially the same construction as that of the main filter; a signal generator for generating a signal of a frequency equal to a cut-off frequency of each of the main filter and the subordinate filter and supplying it to the subordinate filter; a phase difference detector for detecting a phase difference between the signal generated from the signal generator and an output signal of the subordinate filter and outputting a phase difference signal; a reference signal generator for generating a reference signal corresponding to an ideal value of the phase difference detected by the phase difference detector; and an error detector for detecting an error between the phase difference signal and the reference signal and supplying an error signal as an external control signal to the main filter and the subordinate filter.

A phase shift amount which is caused in a subordinate low pass filter at the time of the cut-off frequency is detected. A detection value of the phase shift amount which is caused in the subordinate low pass filter at the time of the cut-off frequency is compared with a reference value at the time of the cut-off frequency which is obtained from phase characteristics. By controlling the cut-off frequency of the subordinate low pass filter on the basis of an output of the comparison, the cut-off frequency of the subordinate low pass filter is controlled to a desired frequency and the cut-off frequency of the main low pass filter can be controlled to a desired frequency.

A comparison output between the detection value of the phase shift amount which is caused in the subordinate low pass filter at the time of the cut-off frequency and the reference value at the time of the cut-off frequency which is obtained from the phase characteristics is obtained by a multiplier. The reference value is generated by a multiplier having characteristics similar to those of such a multiplier. Thus, the errors and variations on the circuits, temperature characteristics, and the like can be cancelled.

The above and other objects and features of the present invention will become apparent from the following detailed description and the appended claims with reference to the accompanying drawings.

DETAILED DESCRIPTION OF THE PREFERRED EMBODIMENTS

Figure 1:
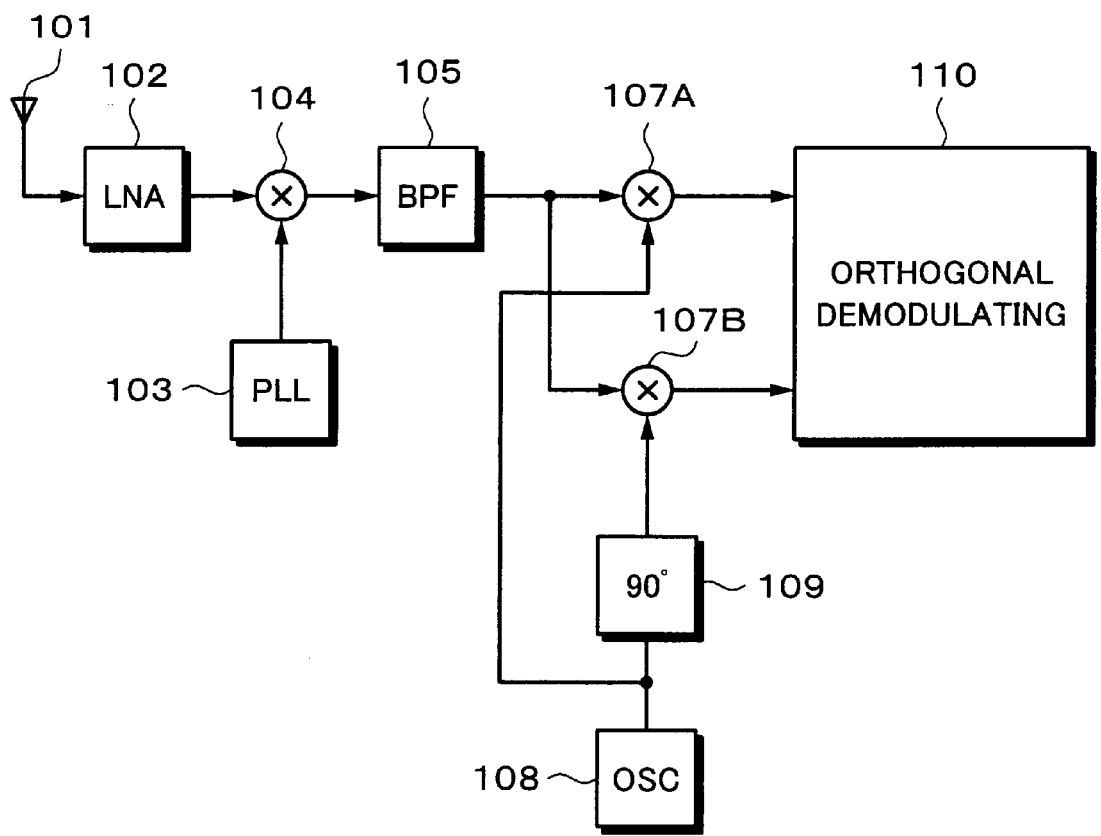
FIG. 1 is a block diagram of an example of a receiving circuit of a conventional radio communicating apparatus.
Figure 2:
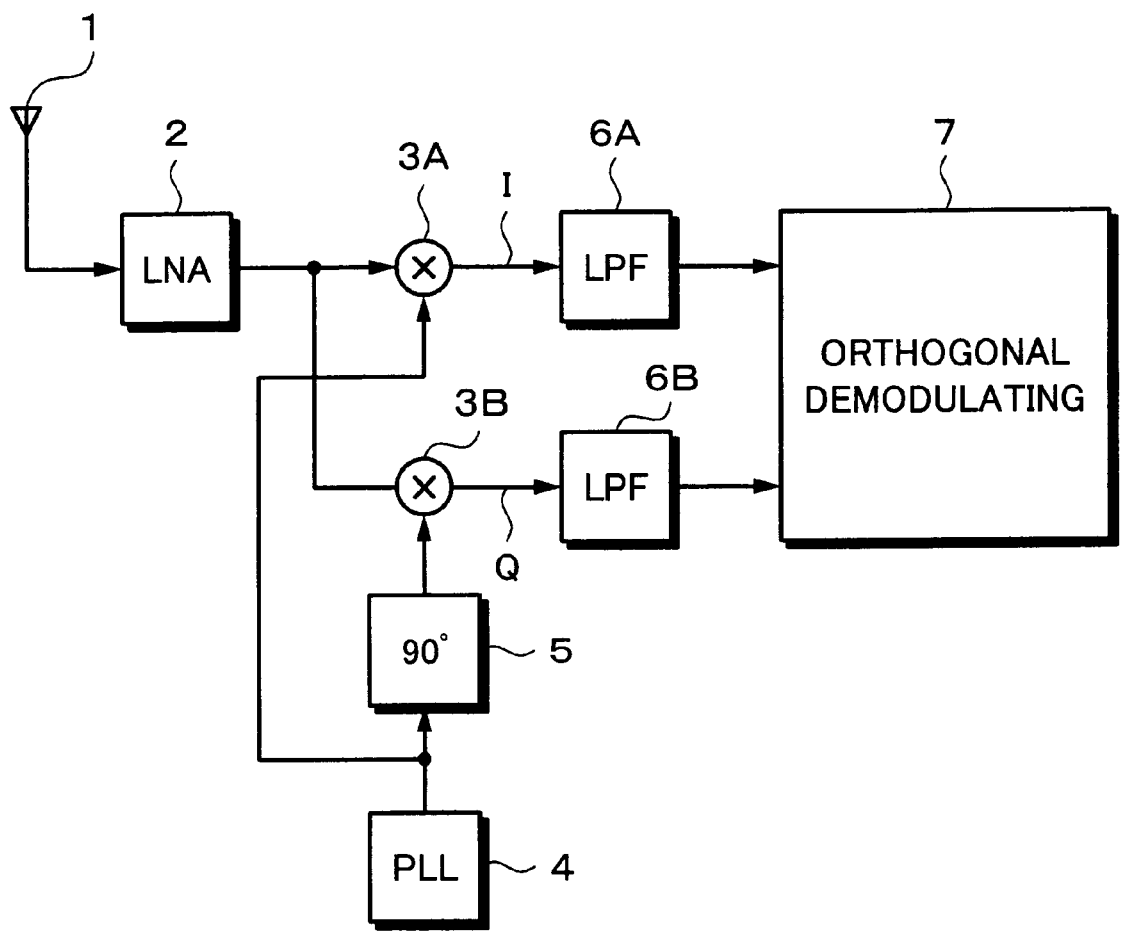
FIG. 2 is a block diagram of an example of a receiving circuit of a radio communicating apparatus to which the invention can be applied.

An embodiment of the invention will now be described hereinbelow with reference to the drawings. FIG. 2 shows an example of a receiving circuit of a mobile wireless apparatus of a single conversion system to which the invention can be applied.

In FIG. 2, an RF signal from an antenna 1 is amplified by an LNA 2 and, thereafter, supplied to multipliers 3A and 3B. A local oscillation signal from a PLL synthesizer 4 is supplied to the multiplier 3A. The local oscillation signal from the PLL synthesizer 4 is phase-shifted by 90° through a phase shifter 5 and supplied to the multiplier 3B. The PLL synthesizer 4 outputs the local oscillation signal of a frequency equal to that of the reception RF signal.

The RF signal and the local oscillation signals whose frequencies are equal to the frequency of the RF signal and whose phases are different by 90° from each other are multiplied by the multipliers 3A and 3B. Thus, an I signal and a Q signal are demodulated from the multipliers 3A and 3B, respectively.

Outputs of the multipliers 3A and 3B are supplied to an orthogonal demodulating circuit 7 through low pass filters 6A and 6B, respectively. A base band signal is demodulated by the orthogonal demodulating circuit 7 from the I signal and Q signal outputted from the multipliers 3A and 3B.

According to the receiving circuit of the direct conversion system as mentioned above, since the IF circuit is unnecessary, an integrated circuit can be easily formed and a circuit scale can be reduced. The invention is suitable for use as low pass filters 6A and 6B in the receiving circuit of such a direct conversion system.

Figure 3:
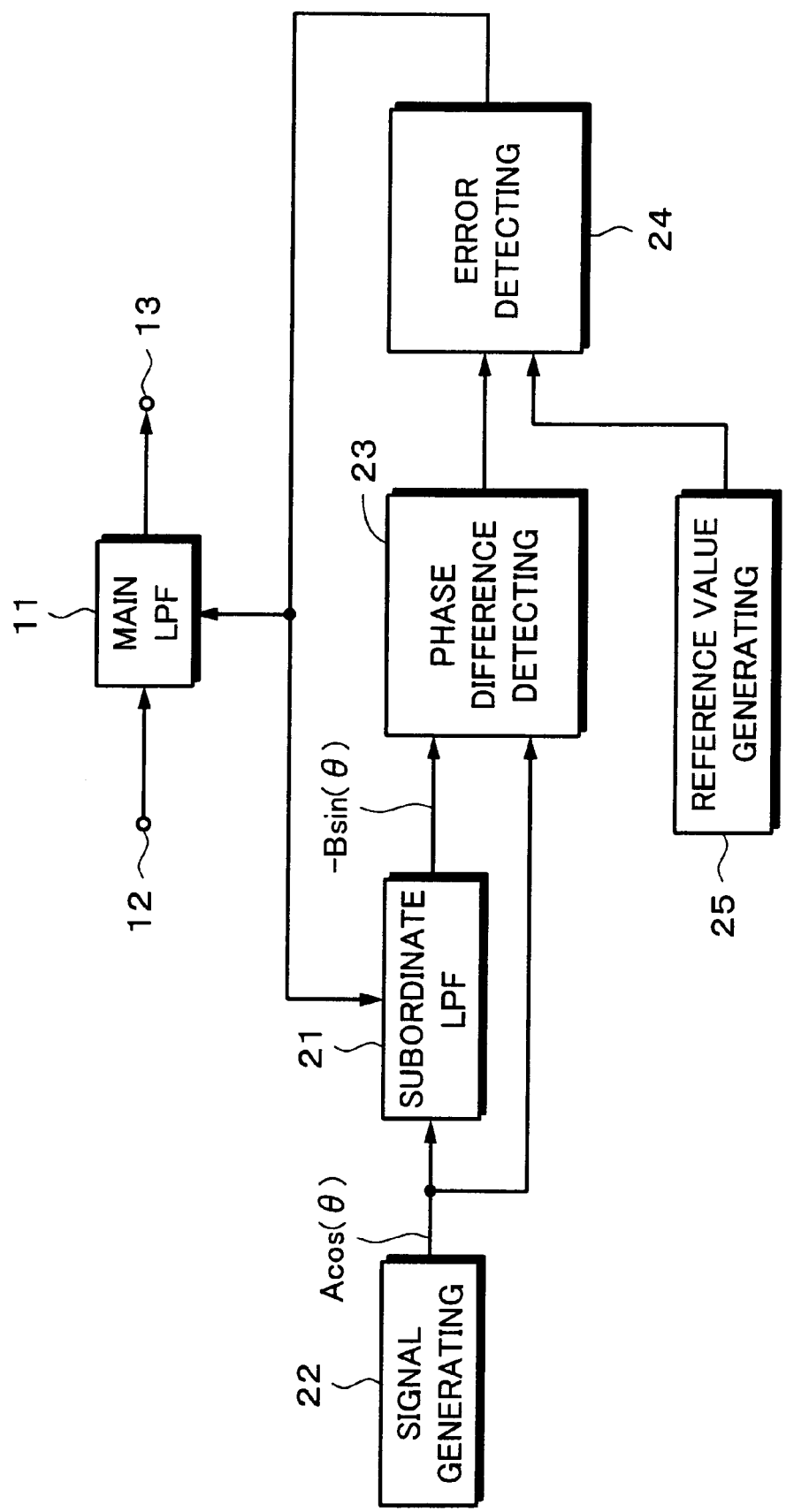
FIG. 3 is a block diagram of an embodiment of the invention.

FIG. 3 shows a construction of a filter circuit to which the invention is applied. According to this filter circuit, a main low pass filter (main LPF) 11 and a subordinate low pass filter (subordinate LPF) 21 having a construction similar to that of the main LPF 11 are prepared.

For example, a secondary active filter is used as a subordinate LPF 21. Cut-off frequencies of the main LPF 11 and subordinate LPF 21 can be set by control signals from the outside.

The main LPF 11 is a filter for actually performing a signal process. An input signal is supplied from an input terminal 12 to the main LPF 11. For example, in the case where the main LPF 11 is used as low pass filters 6A and 6B of the receiving circuit of the direct conversion system as shown in FIG. 2, outputs of the multipliers 3A and 3B are supplied to the input terminal 12. High frequency components in a signal from the input terminal 12 are cut by the main LPF 11. An output of the main LPF 11 is outputted from an output terminal 13.

The subordinate LPF 21 is constructed in a manner similar to the main LPF 11. A signal of a frequency corresponding to the cut-off frequency is supplied from a signal generating circuit 22 to the subordinate LPF 21.

An output of the subordinate LPF 21 is supplied to a phase difference detecting circuit 23. An output of the signal generating circuit 22 is also supplied to the phase difference detecting circuit 23. The phase difference detecting circuit 23 detects a phase difference between the output of the signal generating circuit 22 and the output of the signal generating circuit 22 obtained through the subordinate LPF 21.

An output of the phase difference detecting circuit 23 is supplied to an error detecting circuit 24. A reference value is supplied from a reference value generating circuit 25 to the error detecting circuit 24. The reference value is set to a value based on a phase shift amount that is caused when the signal of the cut-off frequency is supplied to the subordinate LPF 21 in consideration of the phase characteristics. An error value of the phase difference between the output of the signal generating circuit 22 and the output of the signal generating circuit 22 obtained through the subordinate LPF 21 for the reference value is obtained by the error detecting circuit 24.

A negative feedback output of the error detecting circuit 24 is supplied as a control signal to the subordinate LPF 21 and to the main LPF 11. The cut-off frequency of the subordinate LPF 21 is controlled on the basis of the control signal from the error detecting circuit 24. The cut-off frequency of the main LPF 11 is also controlled on the basis of the control signal from the error detecting circuit 24.

As mentioned above, in the filter circuit to which the invention is applied, the signal of the frequency corresponding to the cut-off frequency is supplied from the signal generating circuit 22 to the subordinate LPF 21. The phase shift amount which is caused when the signal of the cut-off frequency is supplied to the subordinate LPF 21 is detected by the phase difference detecting circuit 23. In the error detecting circuit 24, the value corresponding to the phase shift amount which is caused in the subordinate LPF 21 when the signal of the cut-off frequency is supplied is compared with the reference value corresponding to the phase shift amount which should be caused in the subordinate LPF 21 at the time of the cut-off frequency on the phase characteristics. Negative feedback components of an output of this comparison are supplied as a control signal to the subordinate LPF 21, so that the cut-off frequency of the subordinate LPF 21 is controlled.

By such a loop, the phase shift amount of the subordinate LPF 21 is controlled to become a desired phase shift amount which is determined by the phase characteristics of the filter at the time of the cut-off frequency. Thus, the cut-off frequency of the subordinate LPF 21 is controlled to become a desired frequency. Since the main LPF 11 and subordinate LPF 21 are similarly constructed and the similar control signal is supplied to the main LPF 11, the cut-off frequency of the main LPF 11 is also controlled to become a desired cut-off frequency.

That is, the signal of a frequency corresponding to the desired cut-off frequency is generated from the signal generating circuit 22 and an output of the signal generating circuit 22 is supplied to the subordinate LPF 21.

Since the subordinate LPF 21 has the phase characteristics when the signal passes through the subordinate LPF 21, a phase difference according to the phase characteristics is caused between the input signal and the output signal. The signal from the signal generating circuit 22 and the signal from the signal generating circuit 22 in which the phase has been shifted by the passage through the subordinate LPF 21 are supplied to the phase difference detecting circuit 23. Therefore, the detection value corresponding to the phase shift amount at the time when the signal of the frequency corresponding to the cut-off frequency is supplied to the subordinate LPF 21 is detected by the phase difference detecting circuit 23.

The detection value corresponding to the phase shift amount at the time when the signal of the frequency corresponding to the cut-off frequency is supplied to the subordinate LPF 21 is compared with the value corresponding to the phase shift amount at the time when the signal of the frequency corresponding to the cut-off frequency is supplied to the subordinate LPF 21 on the phase characteristics of the filter. On the basis of an output of this comparison, the cut-off frequency of the subordinate LPF 21 is controlled. Thus, the phase shift amount at the time when the signal corresponding to the cut-off frequency is supplied to the subordinate LPF 21 is controlled to become the phase shift amount at the time when the signal of the frequency corresponding to the cut-off frequency determined by the phase characteristics of the filter is supplied. The cut-off frequency of the subordinate LPF 21 is controlled to become a desired frequency. The cut-off frequency of the main LPF 11 is controlled to become a desired frequency.

Figure 4:
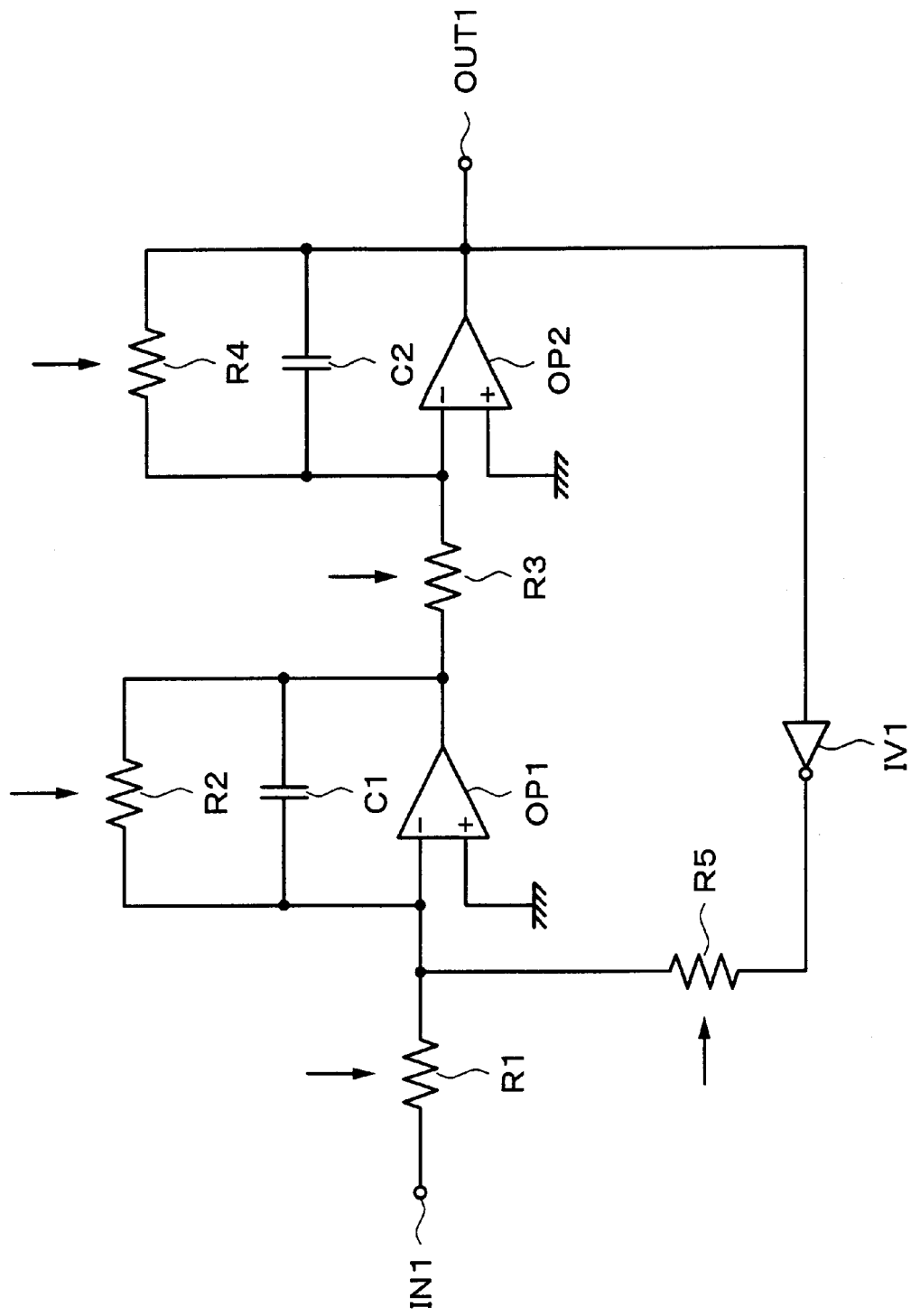
FIG. 4 is a connection diagram of an example of an active filter.

For example, it is assumed that active filters as shown in FIG. 4 are used as a main LPF 11 and a subordinate LPF 21.

In FIG. 4, a resistor R1 is used between an input terminal IN1 and an inverting input terminal of an operational amplifier OP1. A non-inverting input terminal of the operational amplifier OP1 is connected to the ground. A resistor R2 and a capacitor C1 are connected between the inverting input terminal of the operational amplifier OP1 and its output terminal. A resistor R3 is connected between the output terminal of the operational amplifier OP1 and an inverting input terminal of an operational amplifier OP2. A resistor R4 and a capacitor C2 are connected between the inverting input terminal of the operational amplifier OP2 and its output terminal. The output terminal of the operational amplifier OP2 is connected to an output terminal OUT1 and connected to the inverting input terminal of the operational amplifier OP1 through an inverter IV1 and a resistor R5.

A secondary active low pass filter can be realized by the construction shown in FIG. 4. A cut-off frequency of the active low pass filter is determined by resistance values of the resistors R1 to R5. The values of the resistors R1 to R5 are varied by a control voltage from the outside.

Figure 5A:
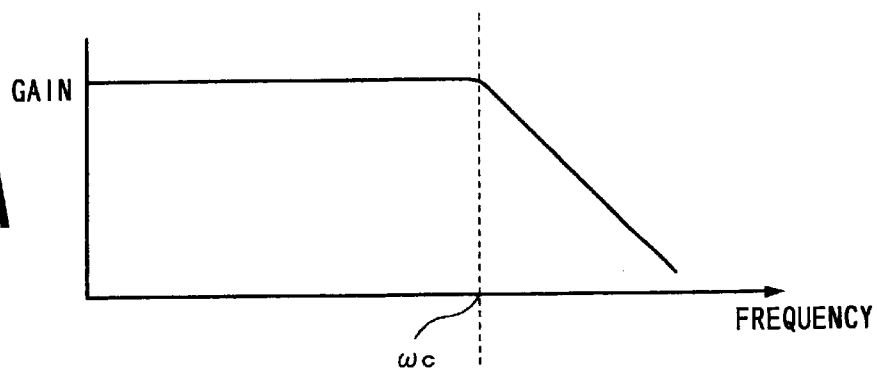
FIGS. 5A and 5B are graphs for use in explanation of characteristics of the active filter.
Figure 5B:
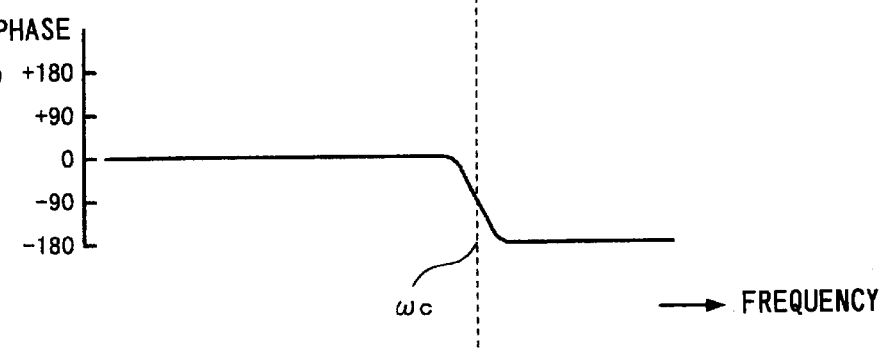

FIGS. 5A and 5B show characteristics of such a secondary active low pass filter. FIG. 5A shows its amplitude characteristics and FIG. 5B shows its phase characteristics. As shown in FIG. 5A, in the secondary active low pass filter, a frequency $\omega_c$ becomes a cut-off frequency, frequencies lower than the frequency $\omega_c$ become a pass band, and frequencies higher than the frequency $\omega_c$ become a cut-off band. As shown in FIG. 5B, in case of the secondary active low pass filter, the phase is equal to 0° at frequencies lower than the cut-off frequency $\omega_c$, a phase lag of 90° is caused at the cut-off frequency $\omega_c$, and a phase lag of 180° is caused at frequencies higher than the cut-off frequency $\omega_c$.

If the secondary active low pass filter as shown in FIG. 4 is used as a main LPF 11 and a subordinate LPF 21 shown in FIG. 3, the phase is equal to −90° at the cut-off frequency as shown in FIG. 5B. As mentioned above, when the phase difference is equal to 90° or −90°, a multiplier can be used as a phase difference detecting circuit 23.

That is, in FIG. 3, assuming that the signal from the signal generating circuit 22 is set to Acos(θ) and the phase lag of 90° occurred due to the passage through the subordinate LPF 21, the output of the signal generating circuit 22 obtained through the subordinate LPF 21 is set to −Bsin(θ). Therefore, in case of using the multiplier as a phase difference detecting circuit 23, if the phase lag of 90° due to the subordinate LPF 21 occurs, the output of the phase difference detecting circuit 23 with the construction of the multiplier is expressed by the following equation (1).

$$A\cos(\theta)\cdot\{-B\sin(\theta)\}=-2AB\sin(2\theta) \quad (1)$$

If the cut-off frequency of the subordinate LPF 21 is deviated to a frequency higher than the desired cut-off frequency, the phase difference between the input signal and the output signal of the subordinate LPF 21 is equal to (90°−ϕ). If the cut-off frequency of the subordinate LPF 21 is deviated to a frequency lower than the desired cut-off frequency, the phase difference between the input signal and the output signal of the subordinate LPF 21 is equal to (90°+ϕ). Therefore, in case of using the multiplier as a phase difference detecting circuit 23, if the cut-off frequency of the subordinate LPF 21 is deviated to the frequency that is higher or lower than the desired cut-off frequency, the output of the phase difference detecting circuit 23 with the construction of the multiplier is obtained by the following equation (2).

$$A\cos(\theta)\cdot\{-B\sin(\theta\pm\phi)\} \quad (2)$$
$$=-\frac{AB}{2}\{\sin(2\theta\pm\phi)+\sin(\pm\phi)\}$$
$$=-\frac{AB}{2}\{\sin(2\theta)\cdot\cos\theta\pm\cos(2\theta)\cdot\sin(\phi)+\sin(\pm\phi)\}$$

From the equation (2), a signal having double frequency components such as $$\frac{AB}{2}\{\sin(2\theta)\cdot\cos(\phi)\pm\cos(2\theta\cdot\sin(\phi)\}$$

and a signal of the DC components of $$\frac{AB}{2}\sin(\pm\phi)$$

are outputted. Therefore, by controlling the subordinate LPF 21 so that the DC components are equal to "0", the phase characteristics of the subordinate LPF 21 are set to −90° and the cut-off frequency of the subordinate LPF 21 can be locked to the desired frequency.

Therefore, in case of using the secondary active filter as a subordinate LPF 21 and using the multiplier as a phase difference detecting circuit 23, the reference value generated from the reference value generating circuit 25 is equal to "0".

The error detecting circuit 24 compares an output of the phase difference detecting circuit 23 with an output of the reference value generating circuit 25 and generates the control signal on the basis of an output of the comparison. A differential amplifier can be used as an error detecting circuit 24.

A control voltage of the resistance value for setting the phase difference between the input signal and the output signal of the subordinate LPF 21 to −90° is assumed to be $V_{Ctr}$, a change in difference from the phase difference of −90° between the input signal and the output signal for a change in control voltage of the resistance value is assumed to be Δϕ, a change amount of the DC components for the change amount Δϕ of the difference from the phase difference of −90° between the two signals inputted to the multiplier is assumed to be ΔVϕ(Δϕ−DC_ref), and a gain of the differential amplifier is assumed to be G. In this case, a convergent voltage of the voltage to control the resistance value in the subordinate LPF 21 is controlled as follows.

$$\text{Vctr\_n} = Vctr + \left(1 - G\frac{\Delta V\phi}{\Delta Vctr}\right)^n \quad (3)$$

By setting n to be infinite as large as possible here, a condition to converge $$\left(1 - G\frac{\Delta V\phi}{\Delta Vctr}\right)^n$$

to $V_{Ctr}$ is as follows.

$$-1 < \left(1 - G\frac{\Delta V\phi}{\Delta Vctr}\right) < 1 \quad (4)$$

That is, $$0 < G\frac{\Delta V\phi}{\Delta Vctr} < 2 \quad (5)$$

By setting an amplitude and a gain of the signal so as to satisfy the equation (5), the control voltage can be controlled to the desired control voltage.

As mentioned above, the phase shift amount which is caused in the subordinate LPF 21 at the time of the cut-off frequency is detected by the phase difference detecting circuit 23. The detection value of the phase shift amount which is caused in the subordinate LPF 21 at the time of the cut-off frequency and the reference value at the time of the cut-off frequency obtained from the phase characteristics are compared by the error detecting circuit 24. By controlling the cut-off frequency of the subordinate LPF 21 by the comparison output, the cut-off frequency of the subordinate LPF 21 is controlled to the desired frequency and the cut-off frequency of the main LPF 11 is controlled to the desired frequency.

Figure 6:
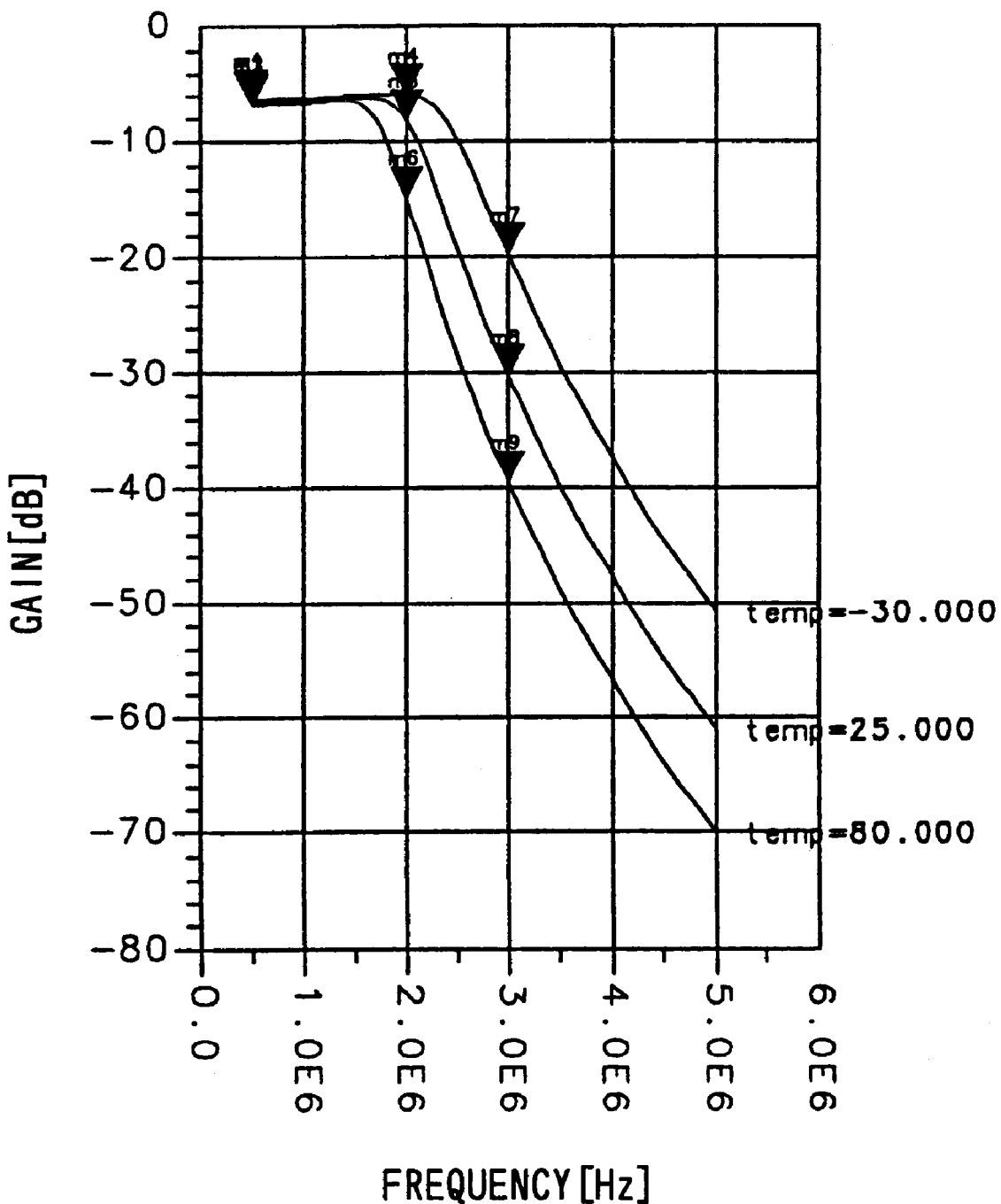
FIG. 6 is a graph showing filter characteristics in the case where a control of a cut-off frequency is not performed.

FIG. 6 shows a simulation of characteristics of the filter in the case where the control of the cut-off frequency is not performed. In FIG. 6, an axis of abscissa indicates a frequency and an axis of ordinate shows a gain. A 7th order active low pass filter is used here as a filter.

The following conditions are required for the low pass filter: that is, a pass band is flat and attenuating characteristics of a stable attenuating band are realized. When an attenuation amount at 3 MHz for a temperature change is confirmed, as will be understood from FIG. 6, the attenuating characteristics of 30 dB are obtained at 25° in an ideal state. However, the attenuating characteristics of 20 dB are obtained at −30°. A change in attenuating characteristics of about 10 dB can be confirmed. In FIG. 6, the temperature is shown as (temp=). As mentioned above, the attenuating characteristics are deteriorated due to a change in temperature environment or the like. In the radio apparatus of the direct conversion system, the deterioration of the characteristics due to the temperature environment causes a deterioration in receiving sensitivity, a deterioration in selection degree, and a variation in spurius characteristics.

Figure 7:
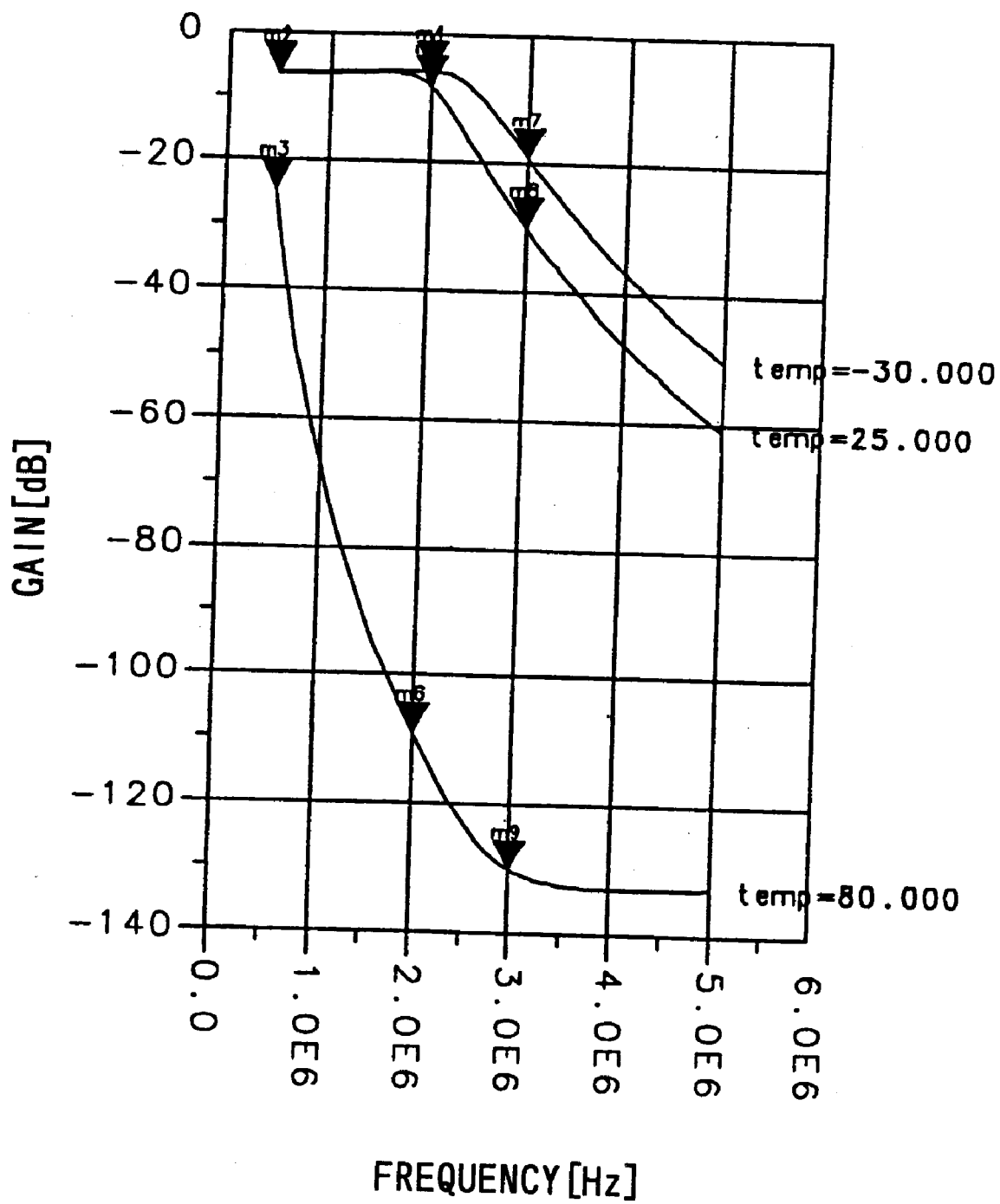
FIG. 7 is a graph showing filter characteristics in the case where the control of the cut-off frequency is performed by using a reference voltage.

FIG. 7 shows frequency characteristics of the filter in the case where the reference value of the reference value generating circuit 25 is set to be constant and the cut-off frequency is controlled to be constant by the control loop shown in FIG. 3.

By providing the control loop of the cut-off frequency as mentioned above, ideally, the frequency characteristics can be controlled to become desired frequency characteristics irrespective of the temperature characteristics. However, as shown in FIG. 7, although variations at the time of 25° corresponding to an ideal state and −30° are small, when the temperature is equal to 80°, if the cut-off frequency is controlled to be constant by the control loop shown in FIG. 3, the characteristics are contrarily deteriorated. It is considered that this is because the conditions of the control loop are not satisfied due to the influence of the temperature characteristics and the frequency characteristics become uncontrollable. It is considered that the device which is particularly influenced by the temperature change is the multiplier used as a phase difference detecting circuit 23. Therefore, it is demanded to remove the influence of the temperature characteristics as mentioned above.

Figure 8:
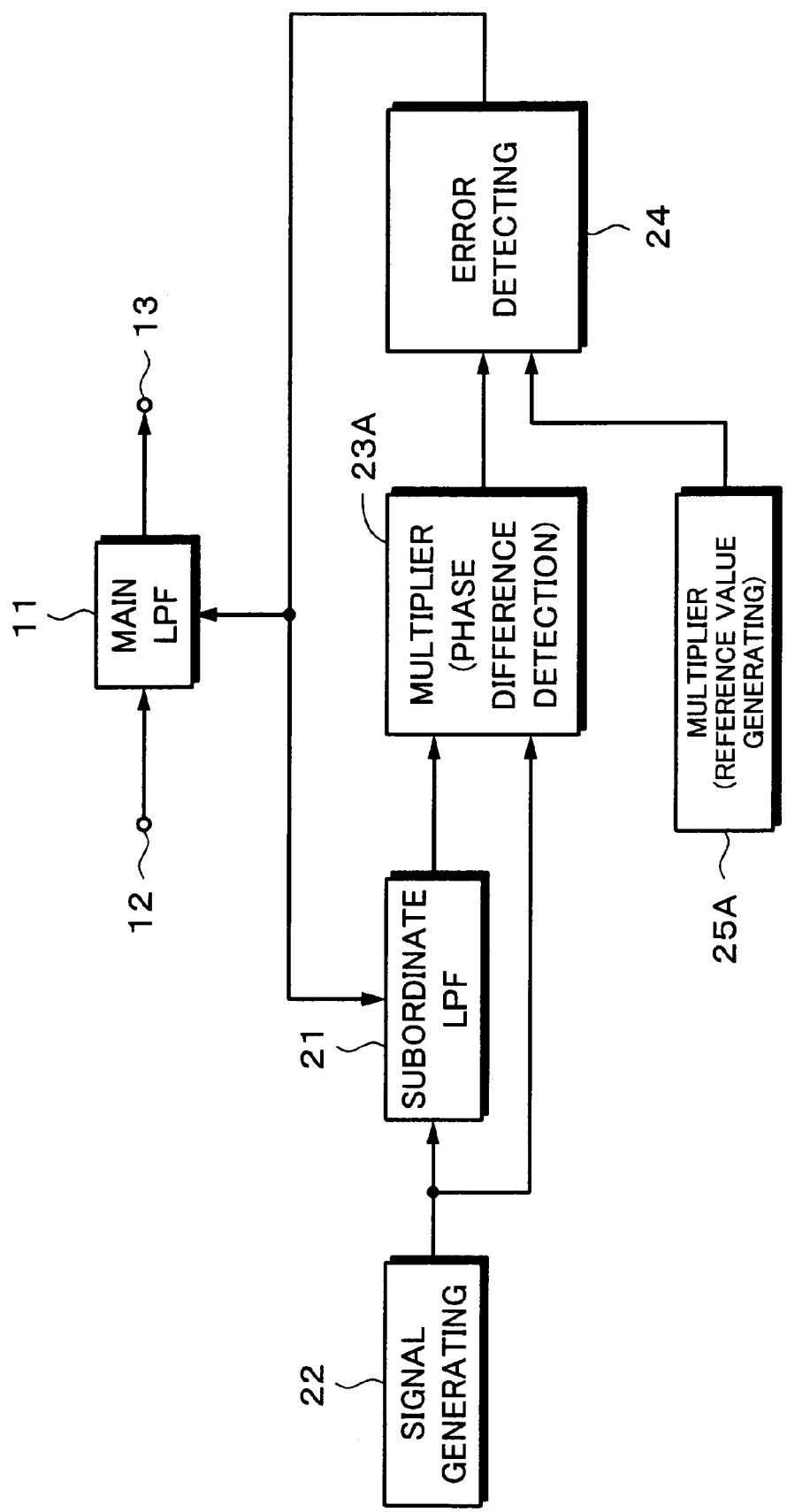
FIG. 8 is a block diagram of another embodiment of the invention.

FIG. 8 shows another embodiment of the invention. In the embodiment, a multiplier 23A is used as a phase difference detecting circuit 23.

There is a difference between the embodiments shown in FIGS. 3 and 8. That is, in this example, a multiplier 25A is used as a reference value generating circuit 25 for generating the reference value. The other construction is similar to that in the foregoing embodiment.

That is, assuming that the multiplier 23A is used as a phase difference detecting circuit 23, the output of the phase difference detecting circuit 23 changes by being influenced by the temperature characteristics of the multiplier. Therefore, the multiplier 25A similar to the multiplier 23A used as a phase difference detecting circuit 23 is prepared as a reference value generating circuit 25.

Figure 9:
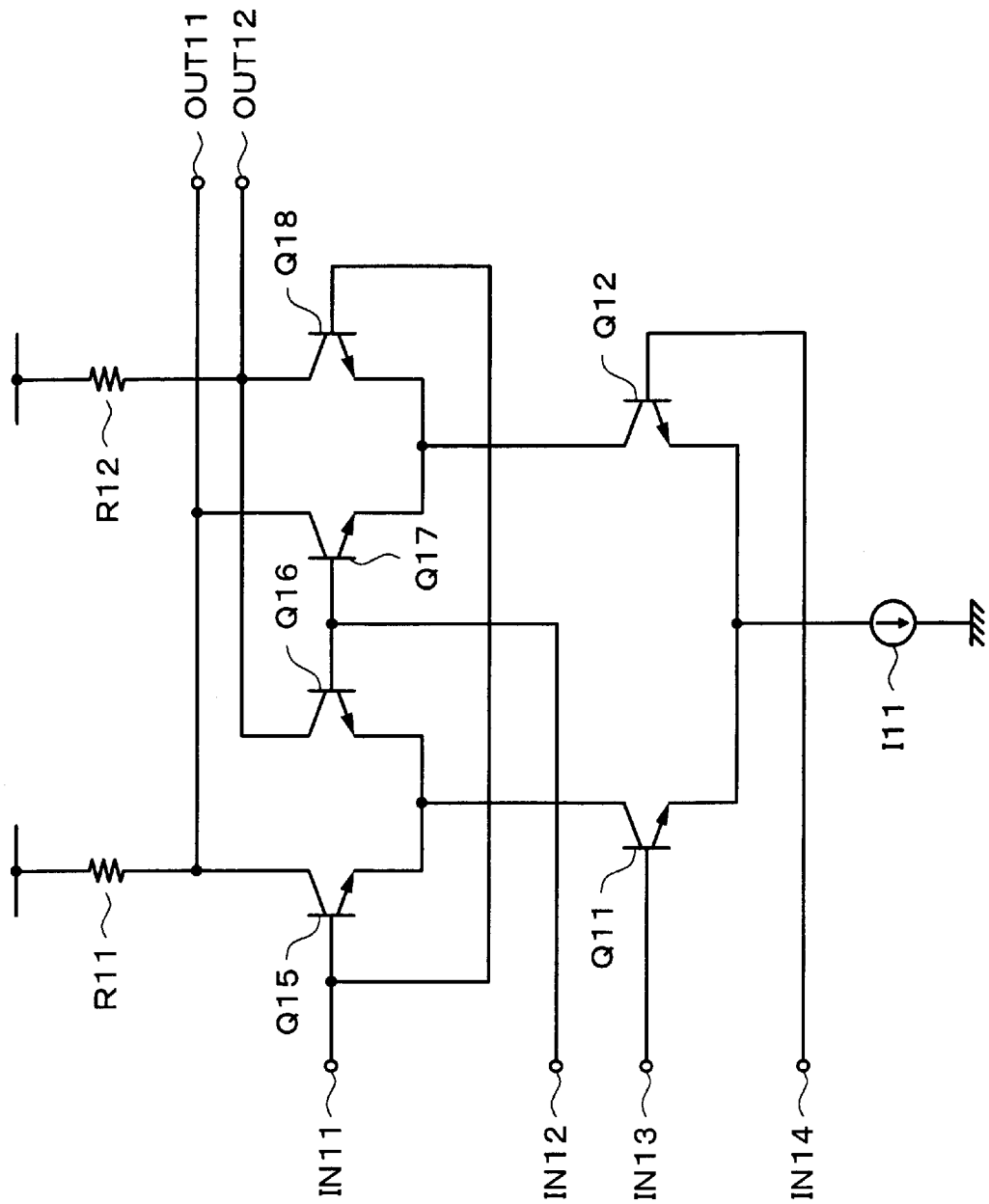
FIG. 9 is a connection diagram showing a construction of a multiplier.

For example, a double-balance circuit as shown in FIG. 9 is used as a multiplier. In FIG. 9, emitters of transistors Q11 and Q12 are connected in common and their node is connected to the ground through a current source I11. Emitters of transistors Q15 and Q16 are connected in common and their node is connected to a collector of the transistor Q11. Emitters of transistors Q17 and Q18 are connected in common and their node is connected to a collector of the transistor Q12. A collector of the transistor Q15 is connected to a collector of the transistor Q17 and their node is connected to a power source terminal through a resistor R11. A collector of the transistor Q16 is connected to a collector of the transistor Q18 and their node is connected to the power source terminal through a resistor R12.

A base of the transistor Q15 and a base of the transistor Q18 are connected in common and their node is connected to an input terminal IN1. A base of the transistor Q16 and a base of the transistor Q17 are connected in common and their node is connected to an input terminal IN12.

An input terminal IN13 is connected to a base of the transistor Q11. An input terminal IN14 is connected to a base of the transistor Q12.

An output terminal OUT11 is connected to a node of the collectors of the transistors Q15 and Q17. An output terminal OUT12 is connected to a node of the collectors of the transistors Q16 and Q18.

According to such a construction, when an input signal is supplied as a differential signal to the input terminals IN11 and IN12 and another input signal is supplied as a differential signal to the input terminals IN13 and IN14, a multiplication output of the two signals is obtained from the output terminals OUT1 and OUT2.

In the multiplier 25A used as a reference value generating circuit 25, output is from the output terminals OUT11 and OUT12 in FIG. 9. For example, no signal is inputted to the input terminals IN11 and IN12 and no signal is inputted to the input terminals IN13 and IN14. The multiplier 23A used as a phase difference detecting circuit 23 and the multiplier 25A used as a reference value generating circuit 25 are arranged at the positions where they are matched on the layout and on the temperature change and processes.

By constructing the phase difference detecting circuit 23 and reference value generating circuit 25 by the similar multipliers 23A and 25A, the variation on the processes and the influence of the temperature characteristics are cancelled and the precision can be improved.

Figure 10:
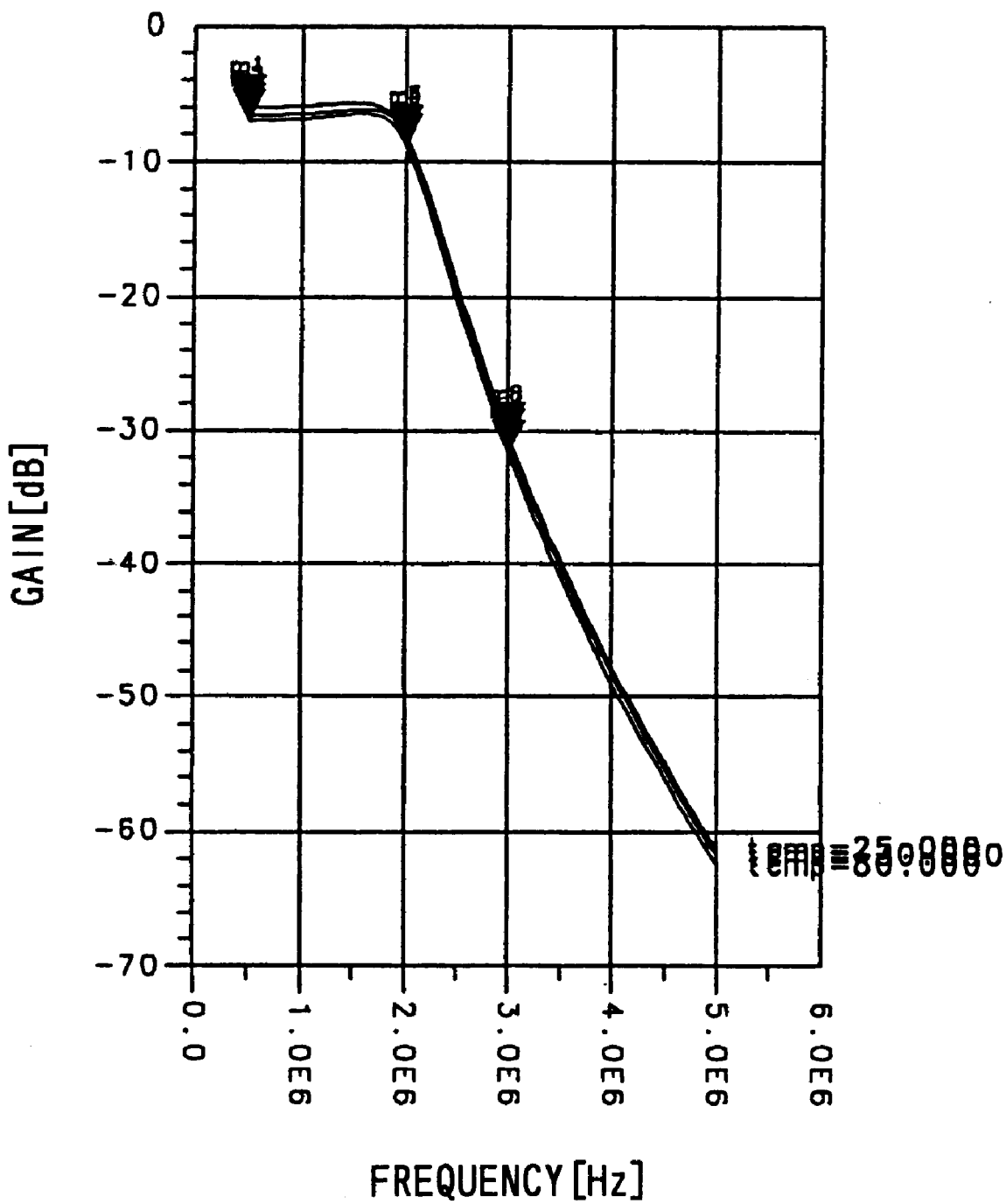
FIG. 10 is a graph showing filter characteristics in the case where the control of the cut-off frequency is performed by performing a temperature compensation.

FIG. 10 shows characteristics of the filter in case of using the multiplier as a reference value generating circuit 25 as shown in FIG. 8. As will be obviously understood from the characteristics shown in FIG. 10, the frequency characteristics can be always set to be constant by cancelling the influence by the temperature characteristics by using the multiplier 25A as a reference value generating circuit 25.

As described above, according to the embodiment of the invention, the phase amount which is caused in the subordinate LPF 21 at the time of the cut-off frequency is detected by the phase difference detecting circuit 23. The phase amount which is caused in the subordinate LPF 21 at the time of the cut-off frequency and the reference value at the time of the cut-off frequency which is obtained from the phase characteristics are compared by the error detecting circuit 24. The cut-off frequency of the subordinate LPF 21 is controlled by the comparison output. Thus, the cut-off frequency of the subordinate LPF 21 can be controlled to the desired frequency and the cut-off frequency of the main LPF 11 can be controlled to the desired frequency. Further, by constructing the phase difference detecting circuit 23 and reference value generating circuit 25 by the similar multipliers 23A and 25A, the variation on the processes and the influence of the temperature characteristics are cancelled and the precision can be improved.

In the above example, although the secondary active low pass filters have been used as main LPF 11 and subordinate LPF 21, a filter of another construction, for example, the 7th order active filter can be also used.

The invention is not limited to the low pass filter but can be also similarly applied to a case of constructing a high pass filter or another filter. Naturally, when the construction of the filter is changed, since the phase characteristics are also changed, it is necessary to set the construction of the phase difference detecting circuit or the construction of the error detecting circuit in accordance with the phase characteristics.

The present invention is not limited to the foregoing embodiment but many modifications and variations are possible within the spirit and scope of the appended claims of the invention.

What is claimed is:

1. A filter apparatus comprising:

a main filter which has an input terminal and an output terminal and whose characteristics is set by an external control signal;

a subordinate filter having substantially the same construction as that of said main filter;

a signal generator for generating a signal of a frequency equal to a cut-off frequency of each of said main filter and said subordinate filter and supplying it to said subordinate filter;

a phase difference detector for detecting a phase difference between the signal generated from said signal generator and an output signal of said subordinate filter and outputting a phase difference signal;

a reference signal generator for generating a reference signal corresponding to an ideal value of the phase difference detected by said phase difference detector; and an error detector for detecting an error between said phase difference signal and said reference signal and supplying an error signal as said external control signal to said main filter and said subordinate filter;

whereby said reference signal is set to a value based on an amount of phase shift that is caused when a signal having a frequency equal to the cut-off frequency of said subordinate filter is supplied to said subordinate filter.

2. An apparatus according to claim 1, wherein the ideal phase difference between the signal generated by said signal generator and the output signal of said subordinate filter is equal to 90° or −90°.

3. An apparatus according to claim 1, wherein said subordinate filter is a secondary active filter.

4. An apparatus according to claim 1, wherein said main filter and said subordinate filter are active filters.

5. An apparatus according to claim 1, wherein said phase difference detector is a multiplier.

6. An apparatus according to claim 5, further comprising compensating means for compensating a variation of said multiplier constructing said phase difference detector.

7. An apparatus according to claim 6, wherein said compensating means is a multiplier substantially similar to the multiplier constructing said phase difference detector, a predetermined value is generated by said multiplier constructing said compensating means, and said predetermined value outputted from said multiplier constructing said compensating means is subtracted from an output of said multiplier constructing said phase difference detector and said subordinate filter is controlled by an output of said subtraction, thereby compensating a variation of characteristics of said phase difference detector constructed by said multiplier.

* * * * *